United States Patent
Schwitzer et al.

(10) Patent No.: US 10,761,625 B2
(45) Date of Patent: Sep. 1, 2020

(54) STYLUS FOR OPERATION WITH A DIGITIZER

(71) Applicant: Microsoft Technology Licensing, LLC, Redmond, WA (US)

(72) Inventors: Amit Schwitzer, Hertzeliya (IL); Ahia Peretz, Ramat Gan (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 16 days.

(21) Appl. No.: 15/800,014

(22) Filed: Oct. 31, 2017

(65) Prior Publication Data
US 2019/0129522 A1    May 2, 2019

(51) Int. Cl.
| | | |
|---|---|---|
| G06F 3/033 | (2013.01) |
| G06F 3/038 | (2013.01) |
| H01R 4/02 | (2006.01) |
| H05K 1/11 | (2006.01) |
| H05K 1/16 | (2006.01) |
| H05K 3/00 | (2006.01) |
| G06F 3/044 | (2006.01) |
| G06F 3/0354 | (2013.01) |

(52) U.S. Cl.
CPC ........ *G06F 3/0383* (2013.01); *G06F 3/03545* (2013.01); *G06F 3/044* (2013.01); *H01R 4/023* (2013.01); *H05K 1/118* (2013.01); *H05K 1/165* (2013.01); *H05K 3/0014* (2013.01); *H05K 2201/052* (2013.01); *H05K 2201/055* (2013.01); *H05K 2201/09027* (2013.01); *H05K 2203/0169* (2013.01); *H05K 2203/0195* (2013.01)

(58) Field of Classification Search
CPC .. G06F 3/03545; G06F 3/0441; G06F 3/0442; G06F 3/0383; G06F 3/044; H05K 3/0014; H05K 1/165; H05K 1/118; H01R 4/023
USPC ........................................ 345/179; 178/19.01
See application file for complete search history.

(56) References Cited

U.S. PATENT DOCUMENTS

| | | |
|---|---|---|
| 6,914,596 B2 | 7/2005 | Liu et al. |
| 7,196,695 B2 | 3/2007 | Lin |
| 7,839,394 B2 | 11/2010 | Zloter et al. |
| 8,308,387 B2 | 11/2012 | King et al. |
| 8,366,338 B2 | 2/2013 | Underwood et al. |
| 8,963,890 B2 | 2/2015 | Raif et al. |

(Continued)

FOREIGN PATENT DOCUMENTS

| | | |
|---|---|---|
| EP | 3037935 A1 | 6/2016 |
| WO | 9945361 A1 | 9/1999 |

OTHER PUBLICATIONS

"International Search Report and Written Opinion Issued in PCT Application No. PCT/US18/057191", dated Feb. 4, 2019, 13 Pages.

*Primary Examiner* — Adam J Snyder

(57) ABSTRACT

A stylus for operation with a digitizer device is described. The stylus comprises a housing, at least one transmitter within the housing, electronic circuitry within the housing, the electronic circuitry configured to generate a signal for transmission by the transmitter such that in use, the digitizer device is able to detect the transmitted signal and infer a position of the transmitter with respect to the digitizer device; and an electrically conducting connector. The connector connects the transmitter to the electronic circuitry, and conveys the generated signal from the electronic circuitry to the transmitter. The connector and the transmitter are formed as a single element.

20 Claims, 13 Drawing Sheets

(56) References Cited

U.S. PATENT DOCUMENTS

| | | |
|---|---|---|
| 9,182,856 B2 | 11/2015 | Logan et al. |
| 9,600,117 B2 | 3/2017 | Katsurahira |
| 2008/0166175 A1 | 7/2008 | Pittel et al. |
| 2013/0106724 A1* | 5/2013 | Pedersen ............... G06F 3/0346 345/173 |
| 2014/0002422 A1* | 1/2014 | Stern ................... G06F 3/03545 345/179 |
| 2014/0028577 A1 | 1/2014 | Krah et al. |
| 2014/0258901 A1* | 9/2014 | Cho ................... G06F 3/04883 715/765 |
| 2015/0062070 A1 | 3/2015 | Fang |
| 2015/0116291 A1 | 4/2015 | Leung et al. |
| 2015/0138164 A1* | 5/2015 | Hinson ................ G06F 3/0383 345/179 |
| 2015/0138165 A1* | 5/2015 | Hinson ............... G06F 3/03545 345/179 |
| 2015/0309598 A1 | 10/2015 | Zeliff et al. |
| 2015/0338930 A1* | 11/2015 | Hara ................... G06F 1/3206 345/158 |
| 2017/0068340 A1 | 3/2017 | Zimmerman et al. |

* cited by examiner

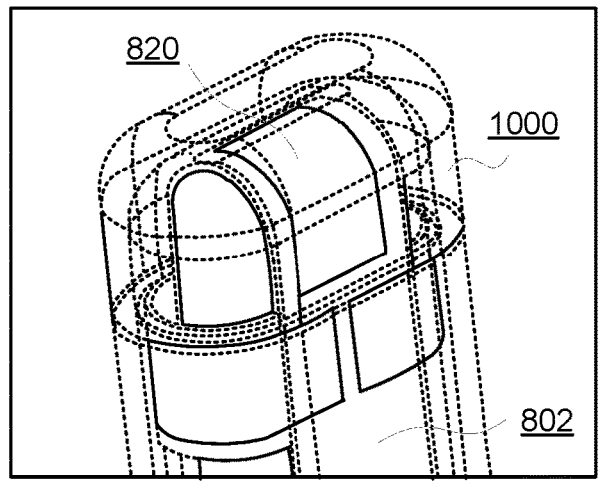
FIG 10A
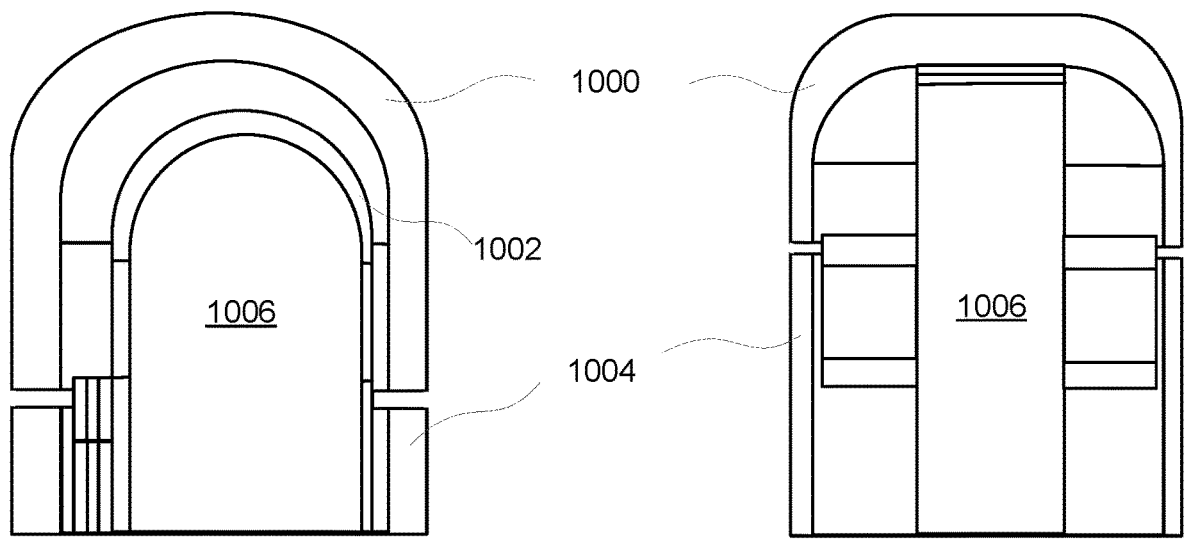
FIG 10B
FIG 10C

STYLUS FOR OPERATION WITH A DIGITIZER

BACKGROUND

Touch screen displays such as in tablet computers, smart phones and other electronic devices, typically incorporate a digitizer which operates to sense location relative to the touch screen of a user's finger or a stylus. The present technology is concerned with a stylus and in particular, but not limited to, a transmitter within the stylus for communicating with a digitizer device.

Cost and ease of manufacture of such a stylus is an ongoing consideration, as are the considerations of the limited space available within the stylus and the quality of the signals transmitted by one or more transmitters in the stylus.

The embodiments described below are not limited to implementations which solve any or all of the disadvantages of known transmitters or styli.

SUMMARY

The following presents a simplified summary of the disclosure in order to provide a basic understanding to the reader. This summary is not intended to identify key features or essential features of the claimed subject matter nor is it intended to be used to limit the scope of the claimed subject matter. Its sole purpose is to present a selection of concepts disclosed herein in a simplified form as a prelude to the more detailed description that is presented later.

In various examples there is a stylus for operation with a digitizer device. The stylus comprises a housing, at least one transmitter within the housing, electronic circuitry within the housing, the electronic circuitry configured to generate a signal for transmission by the transmitter such that in use, the digitizer device is able to detect the transmitted signal and infer a position of the transmitter with respect to the digitizer device; and an electrically conducting connector. The connector connects the transmitter to the electronic circuitry, and conveys the generated signal from the electronic circuitry to the transmitter. The connector and the transmitter are formed as a single element.

In various examples there is a transmitter of a stylus. The transmitter comprises a transmitting element configured to transmit a signal to a digitizer device, and an electrically conducting connector. The connector is configured to connect the transmitting element to electronic circuitry in the stylus, and to convey a signal generated by the electronic circuitry to the transmitter for transmission as the signal to the digitizer device. The connector and the transmitter are integral.

In examples there is a method of operating a stylus with a digitizer device. The method comprises generating a signal, using electronic circuitry in the stylus, the signal being for transmission by a transmitter in the stylus to a digitizer device such that the digitizer device is able to infer a position of the transmitter with respect to the digitizer device. The method comprises conveying the generated signal from the electronic circuitry to the transmitter, using an electrically conducting connector connecting the transmitter to the electronic circuitry. The method comprises configuring the transmitter and the electrically conducting connector as a single element.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein:

FIG. 10A is a perspective view of an eraser transmitter housed in a stylus housing;

FIG. 10B is a cross section on an x axis through an eraser end of a stylus with the eraser transmitter of FIG. 10A;

FIG. 10C is a cross section on a y axis through the eraser end of the stylus of FIG. 10A;

Like reference numerals are used to designate like parts in the accompanying drawings.

DETAILED DESCRIPTION

The detailed description provided below in connection with the appended drawings is intended as a description of the present examples and is not intended to represent the only forms in which the present example are constructed or utilized. The description sets forth the functions of the example and the sequence of operations for constructing and operating the example. However, the same or equivalent functions and sequences may be accomplished by different examples.

Electronic devices such as tablet computers, smart phones, smart watches and others often incorporate a touch panel to display information and to receive one or more user inputs made by touching the display. The touch panel is typically a mutual capacitance touch panel with a capacitive sensing medium referred to as a digitizer device incorporating a plurality of row electrodes (referred to as transmit electrodes) and a plurality of column electrodes (referred to as receive electrodes) arranged in a rectangular grid pattern. A drive signal voltage is applied on the transmit electrodes and a voltage is measured at each receive electrode. Since the human body is an electrical conductor, when a finger touches or comes close to the touch panel, an electrostatic field of the touch panel is distorted and this produces a measurable change at the receive electrodes.

Coordinates of the user input at the touch panel are computed from the measured change and interpolation may be used to compute coordinates of user input positions within individual cells of the grid rather than at intersections of the grid.

Where a stylus 200 or pen is used in conjunction with the touch panel, the stylus or pen incorporates one or more drive electrodes (referred to herein as transmitters) so that drive electrodes at the touch panel itself may be used as receive electrodes.

Figure 1:
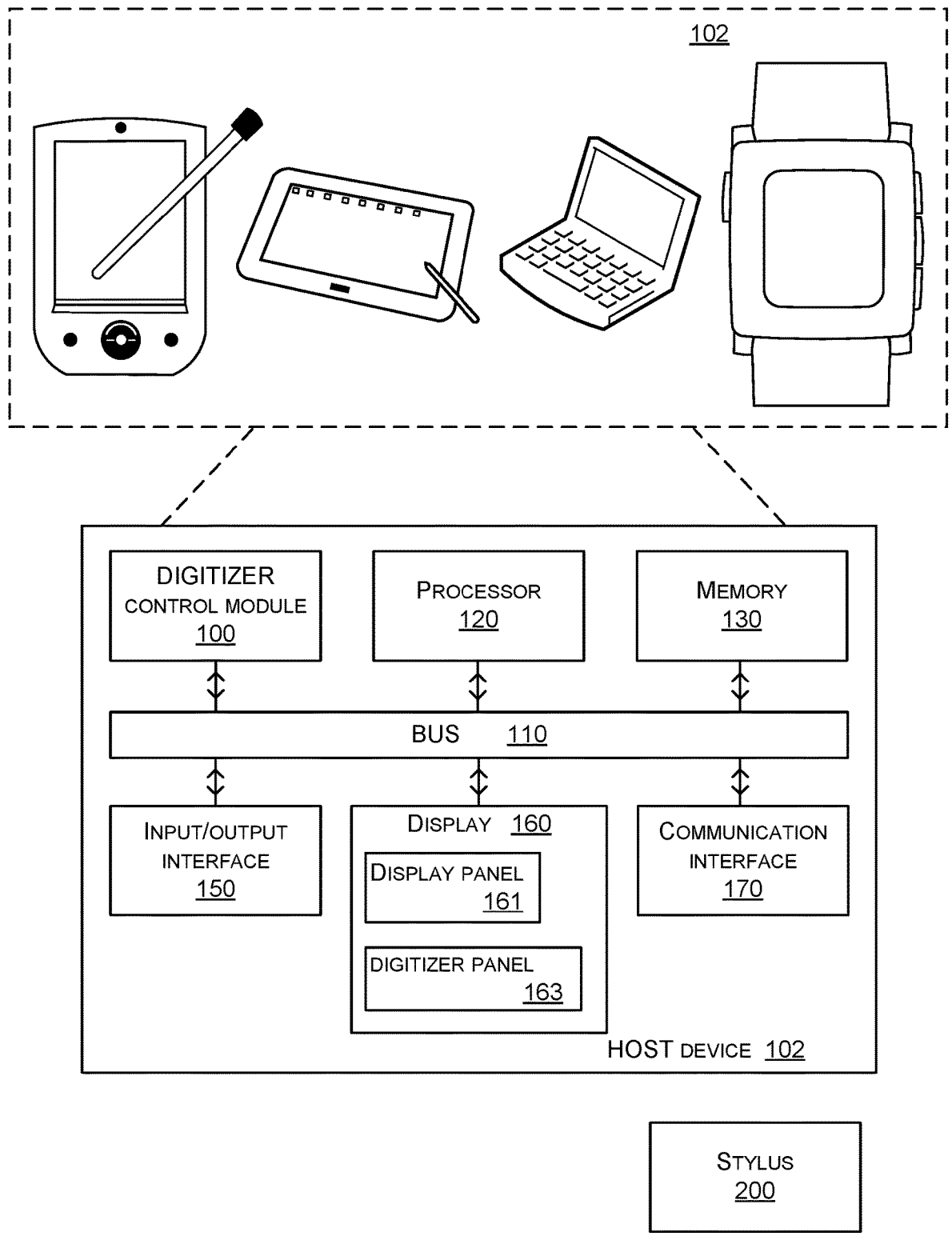
FIG. 1 is a schematic diagram of a computing device with a digitizer panel, and also showing a stylus.

FIG. 1 is a schematic diagram of an electronic device 102 with a touch sensor panel 163 (referred to as a digitizer herein for brevity) and a digitizer control module 100. Together the digitizer and the digitizer control module 100 form a digitizer device. The electronic device 102 is a smart phone, tablet computer, laptop computer, smart watch or any other type of electronic device with a digitizer 163. The electronic device has at least one processor 120, a memory 130, a communication interface 170 such as a radio communications transceiver, a network card, or any other communication interface for enabling wired or wireless communications with other computing entities. The electronic device has an input/output interface 150 for controlling outputs from the electronic device and for controlling inputs received at the electronic device. The electronic device, in some cases, has a display 160 although this is not essential. The display comprises a display panel 161 which may be located in front of or behind the digitizer 163 such as in a conventional smart phone, tablet computer, or smart watch. In some cases the digitizer 163 is a touch pad which is located remote from the display panel 161 as in the case of a laptop computer such as that illustrated in FIG. 1. A bus 110 connects various of the components of the electronic device 102 such as the digitizer control module 100, the processor 120, the memory 130, the input/output interface 150, the display 160 and the communication interface 170. In the example of FIG. 1 the digitizer 163 is shown as part of the display 160 but this is not essential as mentioned above.

Figure 2:
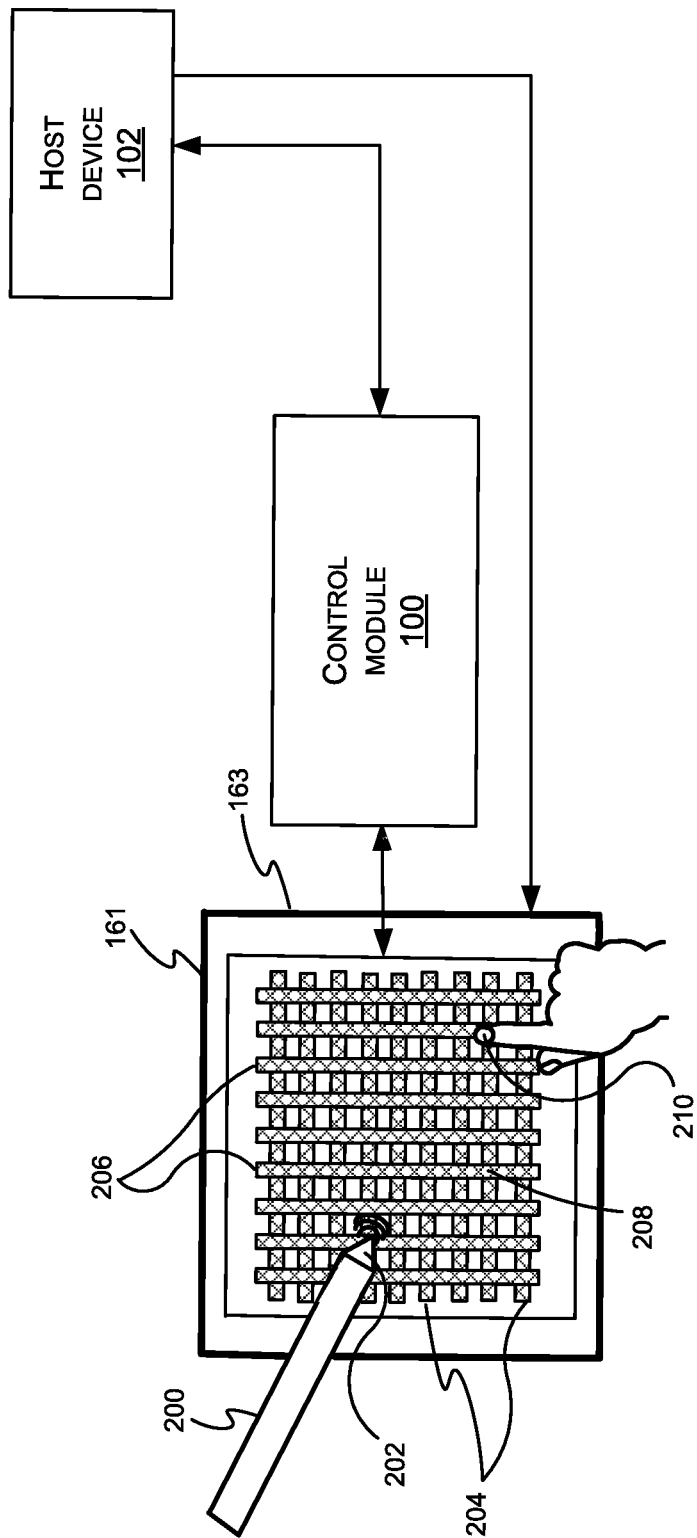
FIG. 2 is a schematic diagram of the digitizer panel of FIG. 1 in more detail.

The digitizer 163 comprises a first array of electrodes arranged substantially parallel with one another and a second array of electrodes arranged substantially parallel with one another. Substantially parallel means within a few degrees of parallel. In some implementations the electrodes in the first array are row electrodes positioned substantially perpendicular to the electrodes in the second array (column electrodes) to form a grid or matrix as illustrated in FIG. 2. While the row electrodes may be referred to as transmit electrodes and the column electrodes may be referred to as receive electrodes, these designations may be reversed with no change in meaning. However, it is not essential for the electrodes to be arranged in a grid. In some cases the row electrodes intersect each column electrode an at angle that is not perpendicular thereby forming a sensor having the form of a parallelogram. In some cases the electrodes form a more complex pattern in which any two rows or columns are not necessarily parallel, or not necessarily laid out along straight lines.

Where the sensor panel is used in front of or within a display (such as a liquid crystal display) the digitizer 163 is substantially transparent to visible wavelengths of light. Specifically, the electrodes in the digitizer are made from transparent conductive material (for example, indium tin oxide), or alternatively, are made from opaque material but with traces so small as to be inconspicuous). In other implementations, the digitizer is not positioned within, in front or behind a display but rather is positioned within a touch pad distinct from the display of the electronic device.

The digitizer 163 is used to measure the capacitance from each row to each column of the electrodes in order to measure the position of an input medium such as a finger, or stylus.

FIG. 2 shows the digitizer 163 in more detail in a case where the electrodes of the digitizer are arranged in a grid to form a grid based capacitive sensor. Stylus 200 transmits an electromagnetic signal which is detected by the capacitive sensor. Touch of one or more fingers 210 or other conductive objects is also detectable by the capacitive sensor. The stylus 200 transmits one or more signal bursts and/or pulses that are transmitted at a defined repetition rate. In some examples, a control module 100 of the digitizer manages a synchronization signal for synchronizing signal bursts emitted by stylus 200 with sampling windows for sampling output from the digitizer 163. Optionally one or more signal bursts and/or pulses are transmitted by stylus 200 including information regarding operation of stylus 200 and/or pressure applied on a tip 202 of the stylus. The signal bursts transmitted by stylus 200 are picked up by one or more of the electrodes of the digitizer 163 on both the horizontal and vertical axes of the grid. In some examples the information is decoded by digitizer circuitry in the control module 100. The location of the stylus tip is computed by the control module 100 and sent to electronic device 102 which is a computing device with which the digitizer is associated.

Optionally a mutual capacitance detection method and/or a self-capacitance detection method are applied on the digitizer 163 for sensing interaction with fingertip of one or more fingers 210. The digitizer control module 100 sends a triggering pulse and/or interrogation signal to one or more electrodes 204, 206 of the digitizer and to sample output from electrodes 204, 206 in response to the triggering and/or interrogation. In some embodiments some or all of the electrodes 204 along one axis of the grid are interrogated simultaneously or in a consecutive manner, and in response to each interrogation, outputs from electrodes 206 on the other axis are sampled. This scanning procedure provides for obtaining output associated with each junction 208 of the grid. This provides for detecting one or more conductive objects such as fingertips touching and/or hovering over the digitizer at the same time (multi touch). In some examples, the digitizer control module 100 alternates between scanning the digitizer 163 for detection of one or more fingertips and sampling outputs on both the horizontal and vertical electrodes for location of a signal transmitted by the stylus 200.

The stylus 200 has a tip transmitter located in its tip 202 and the digitizer is able to detect the position of the stylus tip with respect to the digitizer grid by detecting the signal transmitted by the tip transmitter.

In various examples, the stylus has a tilt transmitter. The digitizer is able to detect tilt of the stylus 200 with respect to the plane of the digitizer 163 where the stylus 200 has a tilt transmitter in addition to a transmitter at the tip 202 of the stylus. The stylus contains a transmitter at its tip which transmits a first signal and it contains a second transmitter (referred to as a tilt transmitter) at a tilt point of the transmitter which transmits a second signal, different from the first signal. The control module 100 computes the location on the digitizer 163 of the tip 202 of the stylus 200 using the first signal. The control module 100 computes the location on the digitizer 163 of the signal received from the tilt point of the stylus 200 using the second signal. The control module 100 knows the length of the stylus 200 and is thus able to compute by triangulation the angle between the longitudinal axis of the stylus 200 and the plane of the digitizer 163.

In various examples the stylus has a plurality of transmitters configured to enable the digitizer and control module 100 to detect rotation of the stylus 200.

The digitizer is able to detect position of a distal end of the stylus 200 where the stylus has at least one transmitter at its distal end. Where the distal end of the stylus 200 is used as an eraser the distal end transmitter is referred to as an eraser transmitter.

The present technology enables space savings within the stylus housing through the use of a transmitter which is integral with a connector that directly connects the transmitter to electronic circuitry in the stylus. Directly connecting means that there is no intervening element. The electronic circuitry generates the signals for transmission by the transmitter to enable it to operate with the digitizer device. Previous solutions have used a separate transmitter and connector and created an electrical connection between these components through a physical fixing (such as soldering) or by holding the connector in biased contact against the transmitter using a biasing means. In contrast, the present technology uses a one piece construction for the transmitter and connector. The one piece construction is found to give significant space saving within the stylus housing which is useful to enable other components and sensors to be housed in the stylus, and/or to reduce the overall thickness or volume of the stylus. Since there is no need for a biasing means to bias the connector into electrical contact with the transmitter the space previously taken by the biasing means is gained. Since there is no need to solder or fix the connector to the transmitter, when the transmitter is in situ within part of the housing during manufacture, there is no need to allow room for this to be achieved.

By manufacturing the transmitter and connector as a single element manufacturing costs are reduced as the number of components to be assembled to manufacture the stylus is reduced. With a one piece construction of the transmitter and stylus there is no need to bias the connector against the transmitter, or to physically solder or fix the connector to the transmitter during manufacture.

Robustness and functioning of the stylus is improved where the one piece construction of the transmitter and stylus is used. This is because there is extremely low risk of the electrical contact between the transmitter and connector being broken. In contrast, with the two piece construction it is found that electrical contact between the components is sometimes lost due to factors such as pressure changes, humidity changes, temperature changes, the stylus being dropped accidentally, dust or moisture entering the stylus housing and other factors.

Figure 3:
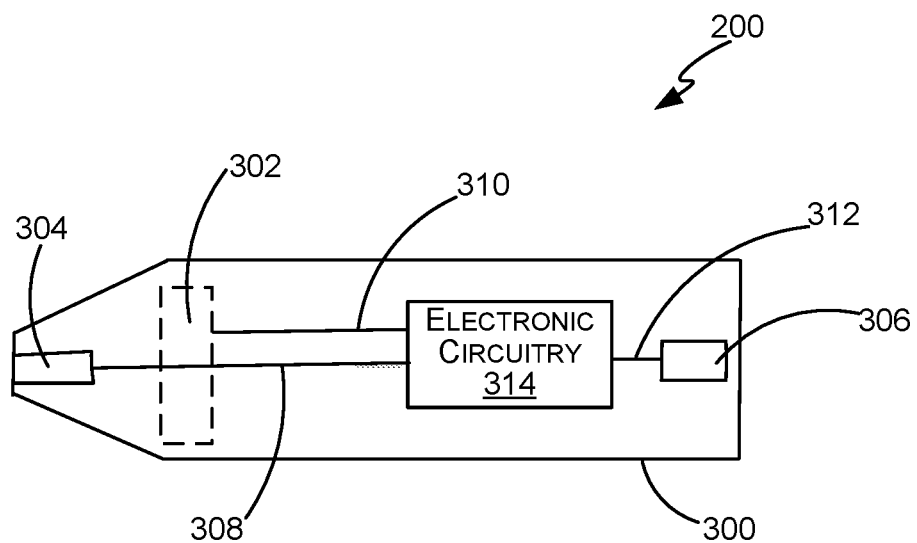
FIG. 3 is a schematic longitudinal cross-section through a stylus.

FIG. 3 is a schematic longitudinal cross section through a stylus 200 to aid understanding of the technology. The stylus 200 is for operation with a digitizer device (not shown in FIG. 3). The stylus 200 has a housing 300, at least one transmitter 302, 304, 306 within the housing 300 and electronic circuitry 314 within the housing 300. The electronic circuitry 314 is configured to generate a signal for transmission by the transmitter 302, 304, 306 such that in use, the digitizer device is able to detect the transmitted signal and infer a position of the transmitter with respect to the digitizer device. The stylus 200 has an electrically conducting connector 308, 310, 312 directly connecting the transmitter 302, 304, 306 to the electronic circuitry 314. The connector 308, 310, 312 is configured to convey the generated signal from the electronic circuitry 314 to the transmitter 302, 304, 306. The connector 308, 310, 312 and the transmitter 302, 304, 306 are formed as a single element.

In the example of FIG. 3 there is a transmitter 304 in the tip of the stylus 200, a transmitter 306 in the distal end (eraser end) of the stylus 200 and a transmitter 302 spaced between the tip of the stylus 200 and the distal end of the stylus. The transmitter 302 spaced between the tip of the stylus 200 and the distal end of the stylus is referred to as a tilt transmitter herein as it is used to compute tilt of the stylus 200 with respect to a plane of a digitizer. It is also possible for the stylus of FIG. 3 to contain further transmitters, such as to enable rotation of the stylus to be detected, but this is not shown in FIG. 3 for clarity.

In the example of FIG. 3 the tip transmitter 304 is an electrically conducting element such as a metallic strip, metallic rod or other electrode which is integral (i.e. integrated) with a connector 308. The connector 308 is electrically conducting and directly connects the tip transmitter 304 to the electronic circuitry 314. In some examples there are no additional components in the electrical path between the tip transmitter 304 and the electronic circuitry 314.

In the example of FIG. 3 the tilt transmitter 302 is behind the connector 308 and so is shown using a dotted line. The tilt transmitter 302 is a one piece construction with a connector 310 which directly connects the tilt transmitter 302 to the electronic circuitry 314. In some examples, more than one tilt transmitter is present, each tilt transmitter being independently driven by the electronic circuitry 314 and having its own connector which is integral (i.e. integrated) with the respective transmitter.

In the example of FIG. 3 an eraser transmitter 306 is of one piece construction with a connector 312 which directly connects the eraser transmitter 306 to the electronic circuitry 314.

Any suitable method of one piece construction of a transmitter and connector is used. These include but are not limited to, constructing a transmitter and associated connector from a single piece of metallic wire, constructing a transmitter and associated connector from a single printed track on a flexible substrate such as a flexible circuit board. Many other one piece constructions of a transmitter and connector are within the scope of the technology.

Figure 4:
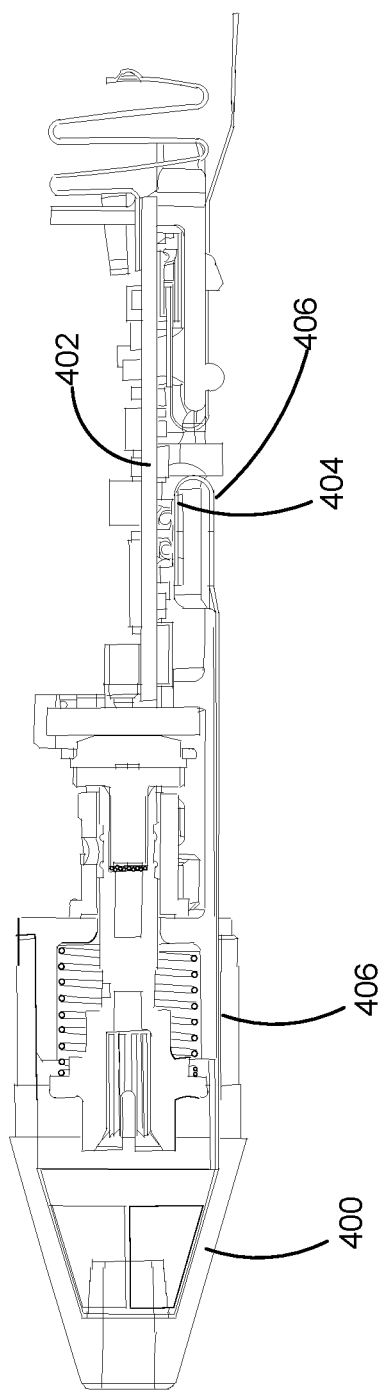
FIG. 4 is a longitudinal cross-section through another stylus and with some of the parts removed for clarity.

The housing 300 is formed from plastic and/or metal and acts to protect the components within the stylus from damage and also provides a structure which is suitable for hand held use by a human user in a manner similar to a conventional pen or pencil. In the example of FIG. 3 not all of the components within the housing 300 are shown for clarity, such as the power supply (for example, a battery and/or a means of receiving power from the digitizer). Other components present in the stylus in some examples include but are not limited to: an accelerometer, a gyroscope, a light sensor, a temperature sensor, a pressure sensor, one or more receive electrodes for operation with the digitizer FIG. 4 is a longitudinal cross-section through another stylus and with some of the parts removed for clarity. In this example, the electronic circuitry is visible as printed circuit board 402 having a plurality of electronic components mounted on an upper and a lower surface of the printed circuit board. On one surface of the printed circuit board is at least one fixing 404 which makes an electrical connection to electrically conducting connector 406.

In the example of FIG. 4 there is a tip shield 400 which is part of the housing and which has a conical portion at the tip end of the stylus which acts to protect the tip antenna (not shown in FIG. 4) and components in the tip of the stylus. The tip shield 400 has a cylindrical portion extending from the conical portion along the length of the stylus towards the distal end of the stylus. Within the conical portion of the tip shield 400 is at least one tilt antenna 408 which is integral with the connector 406. Thus in this example, the tilt antenna 408 and connector 406 are a one-piece construction comprising a conical portion sized and shaped to fit against an inner surface of the tip shield 400 and an elongate portion 406 sized and shaped to extend from the conical portion to the printed circuit board 402 by running along an inner surface of the housing. The one piece tilt antenna 408 and connector 406 are made from electrically conducting material such as metal.

Figure 5:
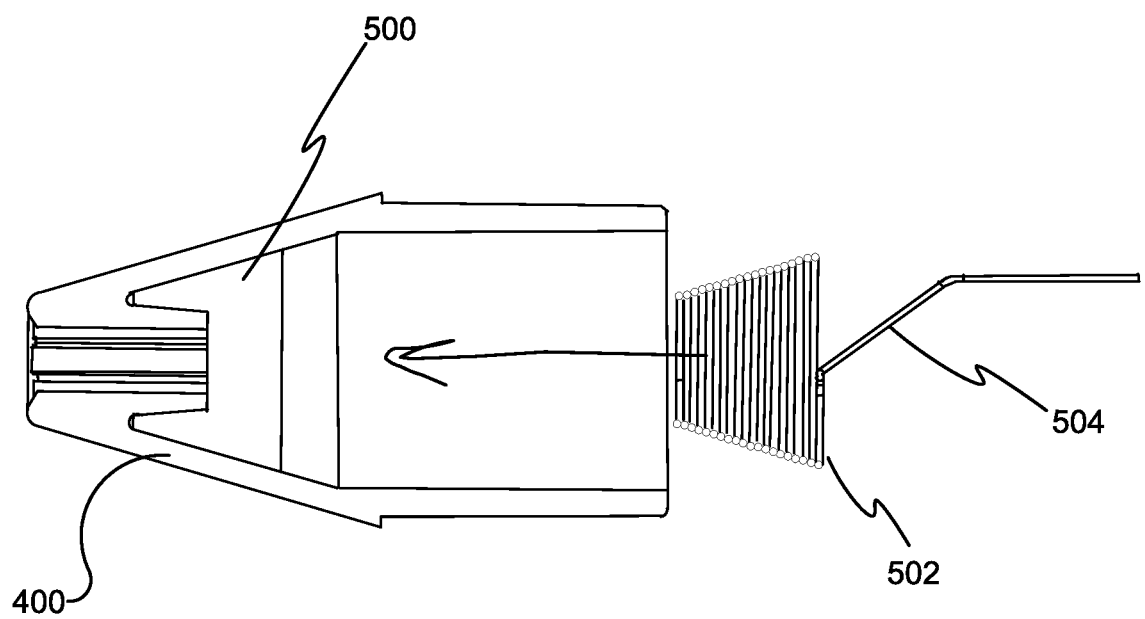
FIG. 5 is a schematic diagram of a wire with a coiled portion and a non-coiled portion, and showing part of a tip end of a stylus.

FIG. 5 shows an example where the tilt antenna is formed from a coil of wire. In this example, the tip shield 400 has a conical inner surface 500. The tilt transmitter and connector are formed from a single piece of wire by making the tilt transmitter from a coiled portion of the wire (where the reference numeral 502 refers to the coiled portion as opposed to the non-coiled portion of the wire which takes reference numeral 504) and making the connector from a non-coiled portion 504 of the wire. In this example the coils of the wire are touching one another but this is not essential. FIG. 5 shows the situation where the tilt antenna and connector are being inserted into the tip shield 400 during manufacture.

Figure 6:
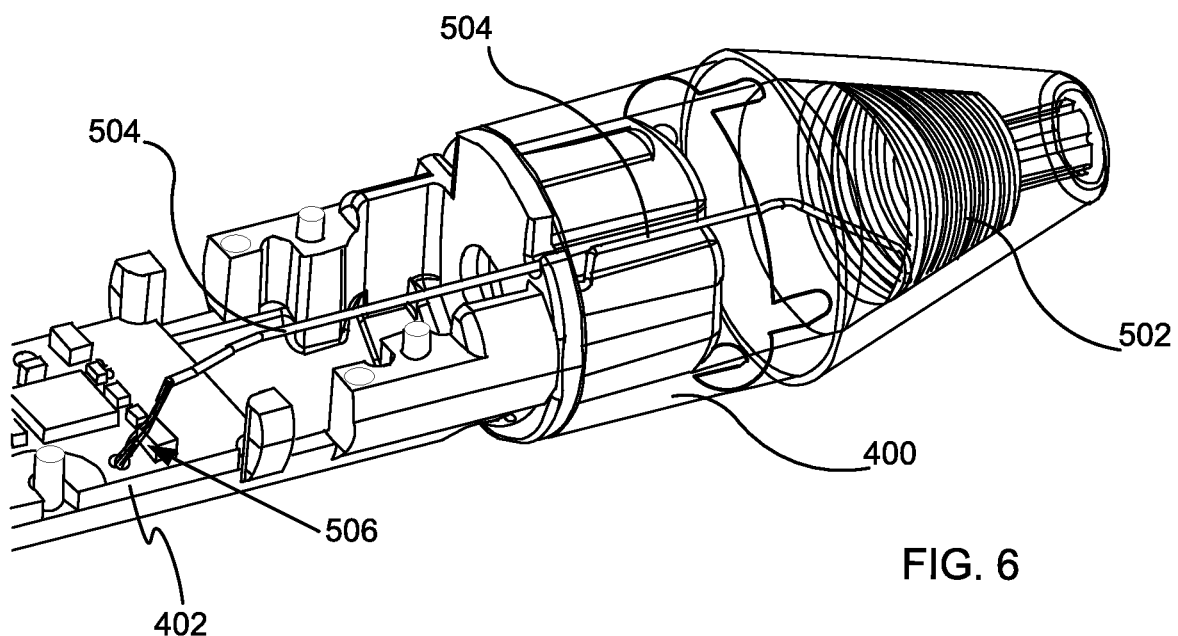
FIG. 6 is a perspective view of components inside part of a stylus.

FIG. 6 shows an example where the tilt antenna and connector of FIG. 5 are inserted into the tip shield 400. The conical coiled portion 502 of the wire which forms the tilt antenna fits against a conical inner surface of the tip shield. The non-coiled portion of the wire 504 extends from the tilt antenna to the printed circuit board 402 and is electrically connected to the printed circuit board 402 by soldering or other suitable fixing.

Figure 6A:
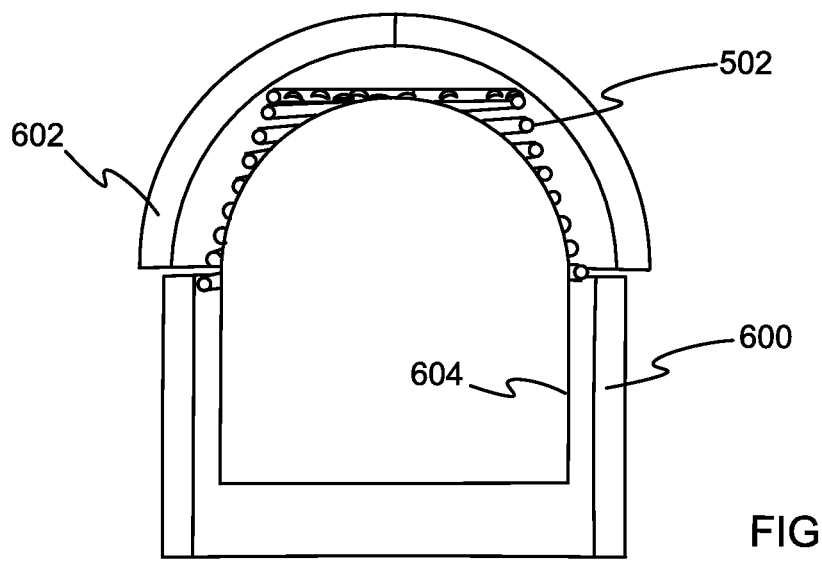
FIG. 6A is a cross section through an eraser end of a stylus.

FIG. 6A shows an example where the transmitter is at a distal end of the stylus. Here the transmitter is implemented using a coiled portion of wire 502 and with a non-coiled portion of the wire 504 (see FIG. 6B) extending from the transmitter to the electronic circuitry (not illustrated in FIG. 6A). The distal end of the stylus comprises a hemispherical cover 602 which is part of the housing 600. The coiled portion of the wire is sized and shaped to fit against an inner surface of the hemispherical cover and to fit over and around a hemispherical or domed part 604 within the distal end of the stylus.

Figure 6B:
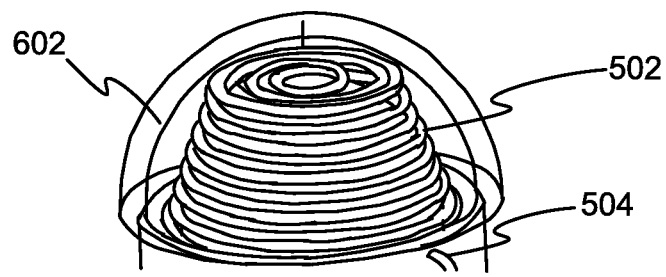
FIG. 6B is a perspective view of an eraser transmitter of the stylus of FIG. 6A.

FIG. 6B shows the example of FIG. 6A from a perspective view where the coiled portion of wire 502 and non-coiled portion of wire 504 are visible. In this figure it is seen that the coils of the wire in portion 502 are not touching one another and are spaced apart. However, this is not essential as in some examples the coils are touching.

Figure 7A:
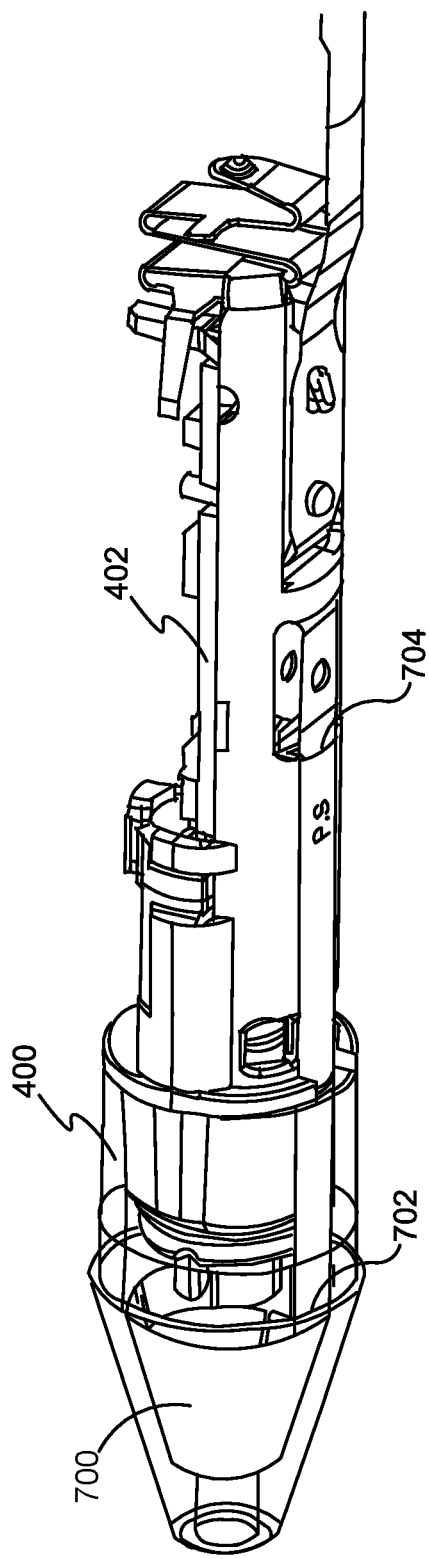
FIG. 7A is a perspective view of components inside part of a stylus with a tilt transmitter formed from a flexible printed circuit board.

In some examples the one piece transmitter and connector are formed as a single conductive track on a flexible printed circuit board as now described with reference to FIG. 7A and FIG. 7B. FIG. 7A is a perspective view of components inside part of a stylus with a tilt transmitter 700 formed from a flexible printed circuit board. The stylus has a tip shield 400 as described earlier in this document. The tip shield has a conical inner surface and the tilt antenna is also conical and sized to fit against the conical inner surface of the tip shield 400. The tilt antenna is a conductive region printed on a flexible substrate. The flexible substrate is a single piece and comprises elongate portion 702 which supports the connector. A conductive track printed on the elongate portion 702 extends from the tilt antenna (704 in FIG. 7A indicates more of the elongate portion 702) and connects to the printed circuit board 402. The conductive track from the tilt antenna to the printed circuit board 402 is not visible in FIG. 7A or FIG. 7B.

Figure 7B:
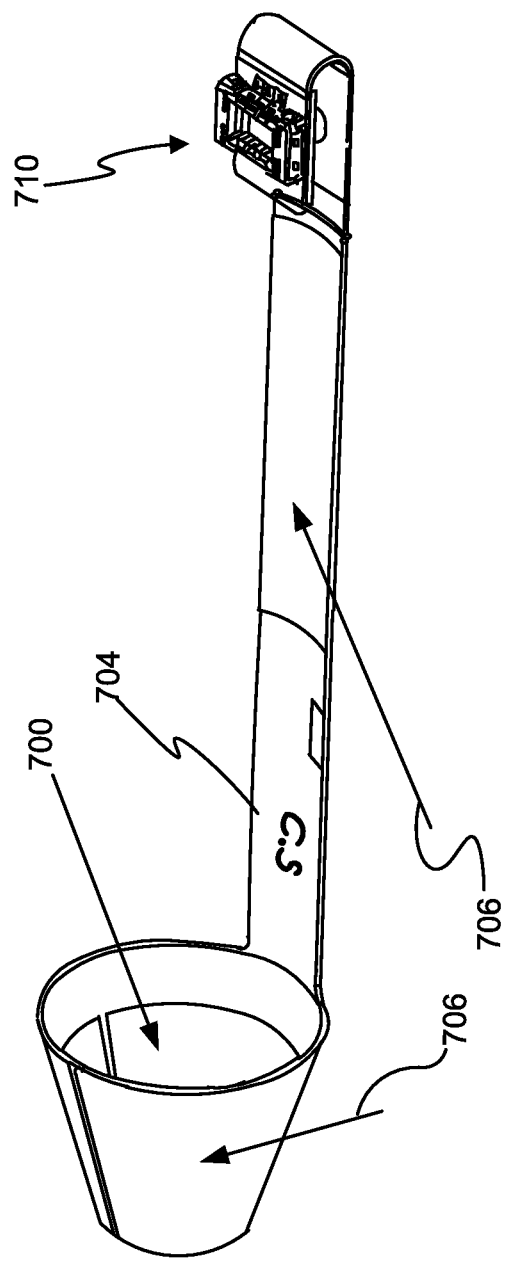
FIG. 7B is a perspective view of a tilt transmitter formed from a flexible printed circuit board.

FIG. 7B shows the one piece tilt transmitter and connector when removed from the stylus of FIG. 7A. Here the conical tilt antenna 700 is visible as well as the elongate portion 704 of the flexible substrate which comprises a conductive track from the tilt antenna 700 to a fixing means 710 (the conductive track is not visible in this figure). The fixing means 710 is for electrical connection between the tilt transmitter and the printed circuit board 402. Pressure sensitive adhesive 706 is present on the outer surface of the conical tilt antenna as well as on regions of the elongate portion. During manufacture, the one piece tilt transmitter and connector of FIG. 7B are inserted in to the tip shield 400 and housing of the stylus and pressed into place to activate the pressure sensitive adhesive.

Figure 8A:
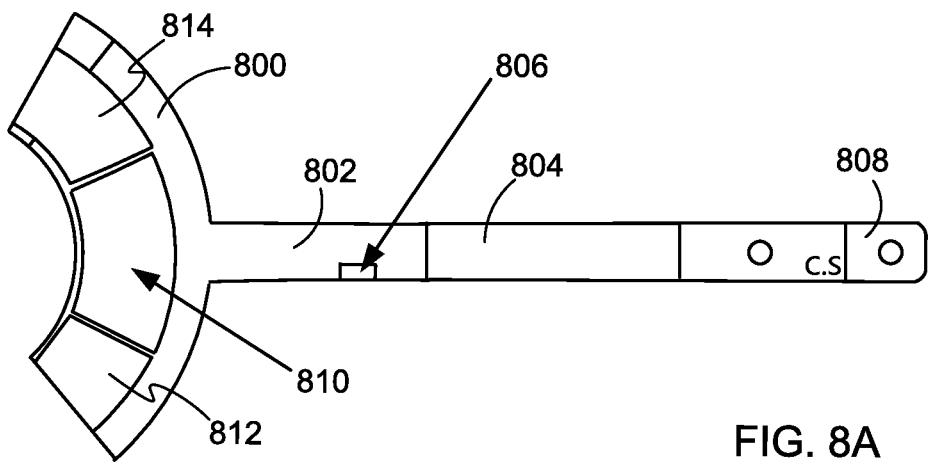
FIG. 8A is a net diagram of a flexible printed circuit board rotate and/or tilt transmitter for a stylus.

FIG. 8A is a net view of an example of a one piece tilt transmitter and connector such as that of FIG. 7A and FIG. 7B. One piece of substantially planar flexible substrate is cut into an arcuate portion 800 having an elongate portion 802 extending from the arcuate portion to form a shape similar to the letter Y. One or more conductive regions 810, 812, are printed onto the arcuate portion, each forming a transmitter. In some examples such as FIG. 8A there are two transmitters 810 and 812 on the arcuate portion. In some examples such as FIG. 8B there is one transmitter on the arcuate portion 800. However, other numbers of transmitters are used in some cases. In the example of FIG. 8A there is a conductive region 806 printed onto the elongate portion but this is not essential.

From each of the transmitters 810, 812 is a conductive track (two separate conductive tracks one for each transmitter) which extends along the elongate portion 802 to the region 808 for fixing to the electronic circuitry in the stylus. These conductive tracks are not visible in FIG. 8A since these are traces on the flex board of the flexible printed circuit board.

During manufacture the arcuate portion 800 is flexed to form a cone which is similar to the conical portion of the tilt antenna 700 of FIGS. 7A and 7B. The underside of the arcuate portion has pressure sensitive adhesive which, after formation of the conical portion, is on the outside of the conical portion and available to adhere to the tip shield. The elongate portion 802 has pressure sensitive adhesive on portions of its upper and under sides in order to adhere to the housing and/or components of the stylus during assembly.

Conductive region 806 on the elongate portion 802 is for connection to a tip antenna of the stylus and is optional. A conductive track extends from conductive region 806 to region 808 for connection to the electronic circuitry in the stylus.

Figure 8B:
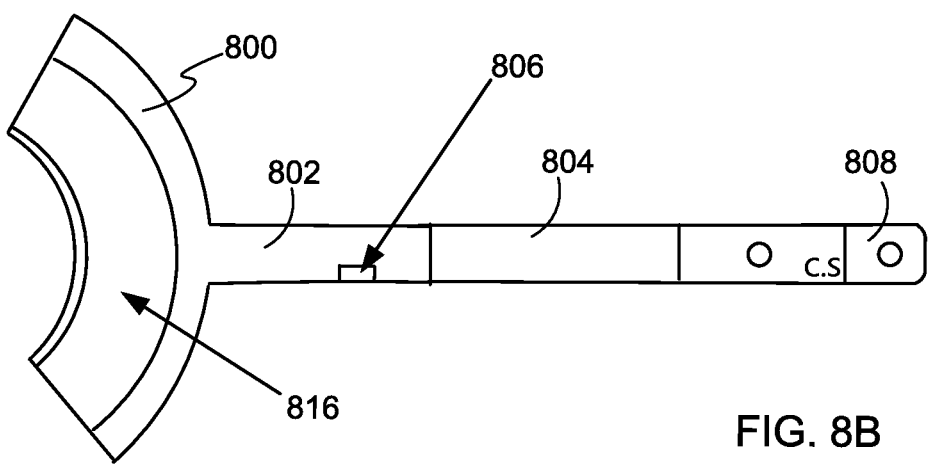
FIG. 8B is a net diagram of a flexible printed circuit board tilt transmitter for a stylus.

FIG. 8B is a net view of another example of a one piece tilt transmitter and connector. In this example there is one transmitter 816 on the arcuate portion 800 and in other respects the example is the same as that of FIG. 8A. A conductive track (not visible in FIG. 8B) runs from the transmitter 816 to the region 808 for connection to the electronic circuitry in the stylus.

Figure 8C:
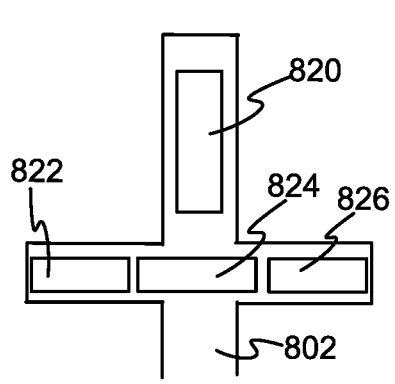
FIG. 8C is a net diagram of a flexible printed circuit board eraser transmitter.

FIG. 8C is a net view of an example of a one piece transmitter and connector for use at the distal end of the stylus. One piece of substantially planar flexible substrate is cut into a cross shape with a first elongate portion 802 and a second elongate portion shorter than the first elongate portion and substantially perpendicular to the first elongate portion. One conductive region 820 is printed on the first elongate portion. Three conductive regions 822, 824, 826 are printed on the second elongate portion. Each of these conductive regions forms a transmitter. Each transmitter has a conductive track printed on the flexible substrate and extending from the transmitter along the first elongate portion to electronic circuitry in the stylus. The conductive tracks are not shown in FIG. 8C.

Figure 8D:
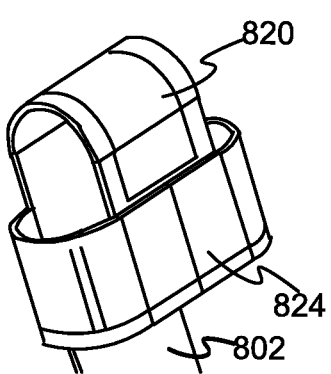
FIG. 8D is a diagram of another flexible printed circuit board eraser transmitter.

FIG. 8D shows how, during manufacture, a substantially planar flexible substrate such as that of FIG. 8C is bent such that the arms of the second elongate portion fold over the first elongate portion 802 and meet one another. Also one end of the first elongate portion 802 is bent to form an arch which meets the arms of the second elongate portion. This gives an arrangement of the transmitters 820, 822, 824, 826 suitable to fit within a distal end of a stylus.

Figure 8E:
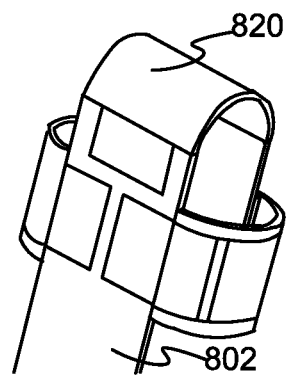
FIG. 8E is a diagram of another flexible printed circuit board eraser transmitter.

FIG. 8E shows another example of how, during manufacture a substantially planar flexible substrate such as that of FIG. 8C is bent such that the arms of the second elongate portion fold over the first elongate portion 802 and meet one another to make an arrangement suitable to fit in a distal end of a stylus. As in FIGS. 8D and 8C the conductive tracks from the transmitters are not shown.

Figure 9:
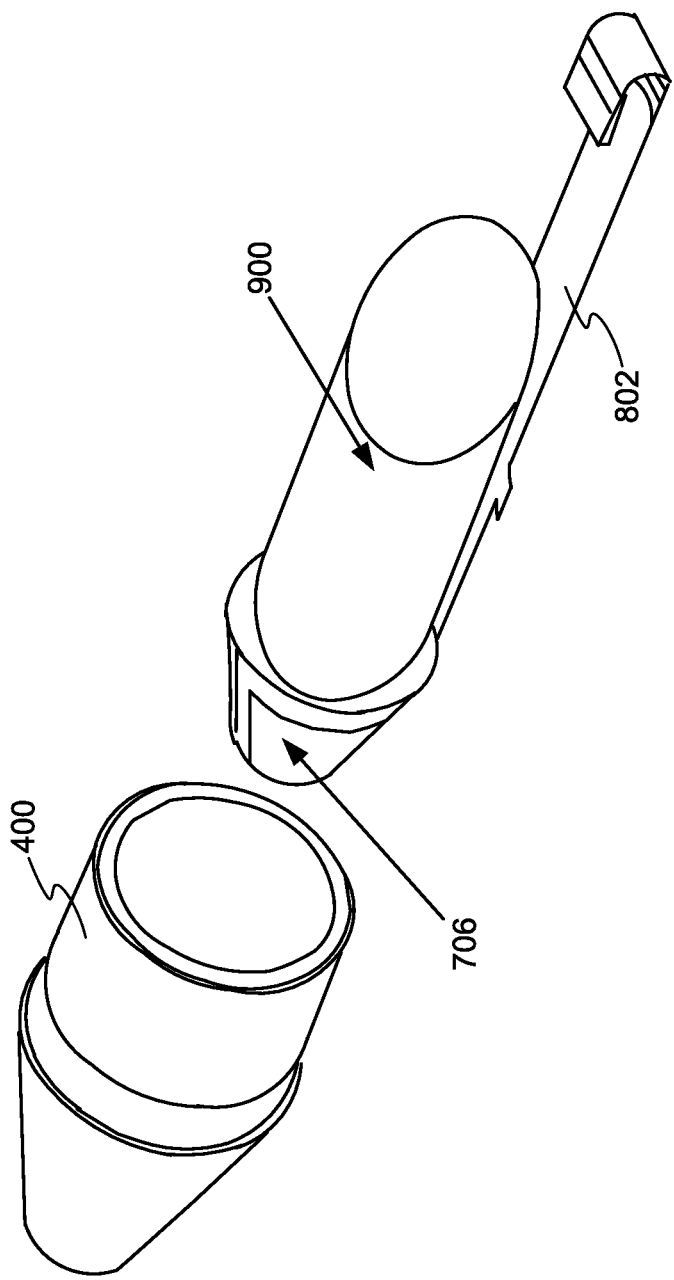
FIG. 9 is a schematic diagram of a tilt transmitter being inserted into a tip shield using a former.

FIG. 9 shows use of a former 900 to press fit a tilt antenna into a tip shield 400 of a stylus. The former 900 is removed after the press fit is completed. The former 900 is used to press the tilt antenna pressure sensitive adhesive 706 onto an inner surface of the tip shield 400. The tilt antenna is formed on a flexible substrate as described earlier in this document and comprises an elongate portion 802 which supports the former 900.

Figure 10:
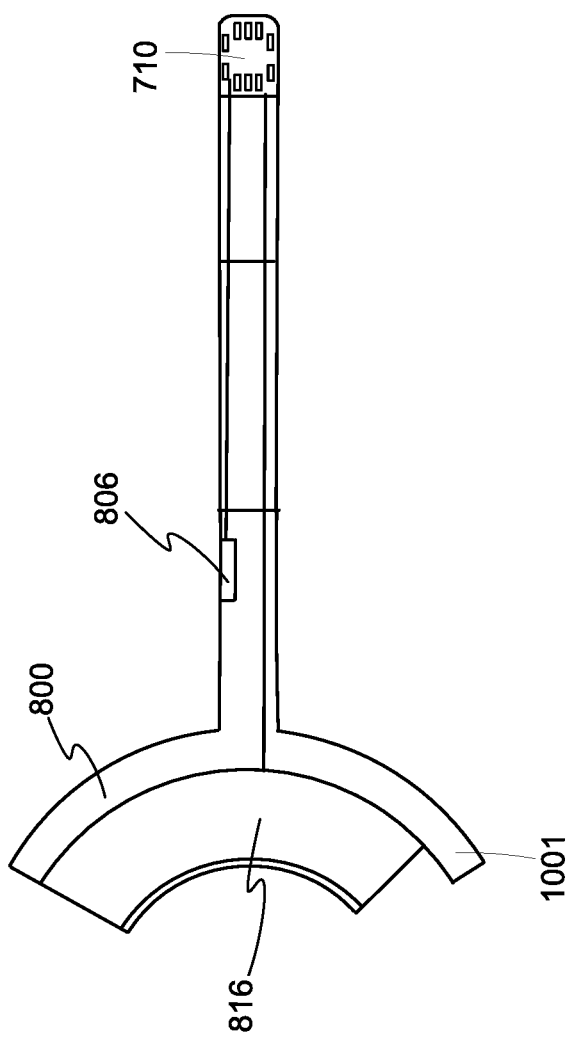
FIG. 10 is a net diagram of another flexible printed circuit board tilt transmitter.

FIG. 10 is a net view of a flexible printed circuit such as those of FIGS. 8A and 8B but in this case the conductive tracks from the transmitter 816 running along the elongate portion are visible. Also, a finger protection from the arcuate portion is visible 1001, which is used to fix the two ends of the arcuate portion together once they are bent into a cone during manufacture.

FIG. 10A is a perspective view of a distal end of a stylus where the housing 1000 holds a flexible substrate supporting a plurality of transmitters and connectors of one piece construction. Each transmitter has a dedicated connector to electronic circuitry in the stylus and the transmitter and dedicate connector are a single continuous conductive track on the flexible substrate. In this example, the transmitters are formed as described above with reference to FIG. 8E.

FIG. 10B is a cross section of the stylus of FIG. 10A along an x axis and showing the housing 1000, a transmitter 1002, a plastic inner domed support 1006 for the flexible substrate, and another part 1004 of the housing.

FIG. 10C is a cross section of the stylus of FIG. 10A along a y axis and showing the housing 1000, a part 1004 of the housing, and the domed support 1006.

Figure 11:
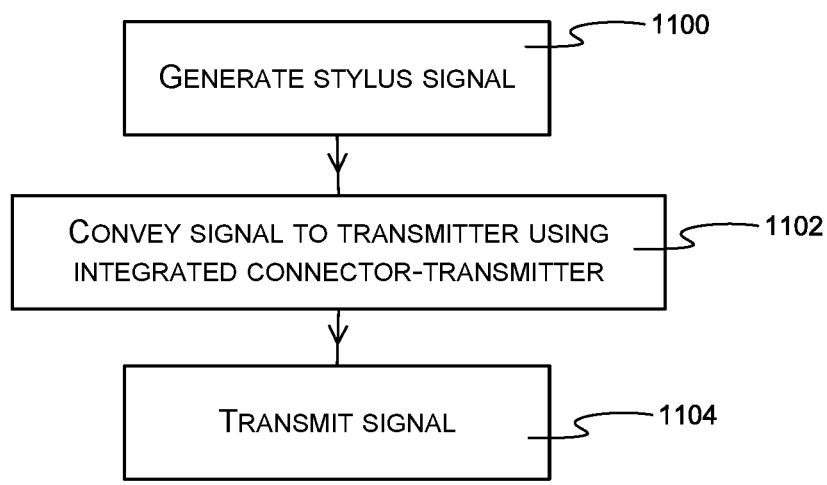
FIG. 11 is a flow diagram of a method of generating and transmitting a stylus signal.

FIG. 11 is a flow diagram of a method of operation of a stylus such as those described herein. The electronic circuitry generates a stylus signal 1100, for example, at a frequency known to a digitizer with which the stylus is to be used. The signal is conveyed 1102 to a transmitter using an integrated connector-transmitter. The integrated connector-transmitter is a one piece construction of a transmitter and connector such as a single piece of wire, a single conductive track printed on a flexible substrate, a single conductive element or other integral component. The transmitter receives the signal which is then transmitter 1104 for reception by a digitizer.

Figure 12:
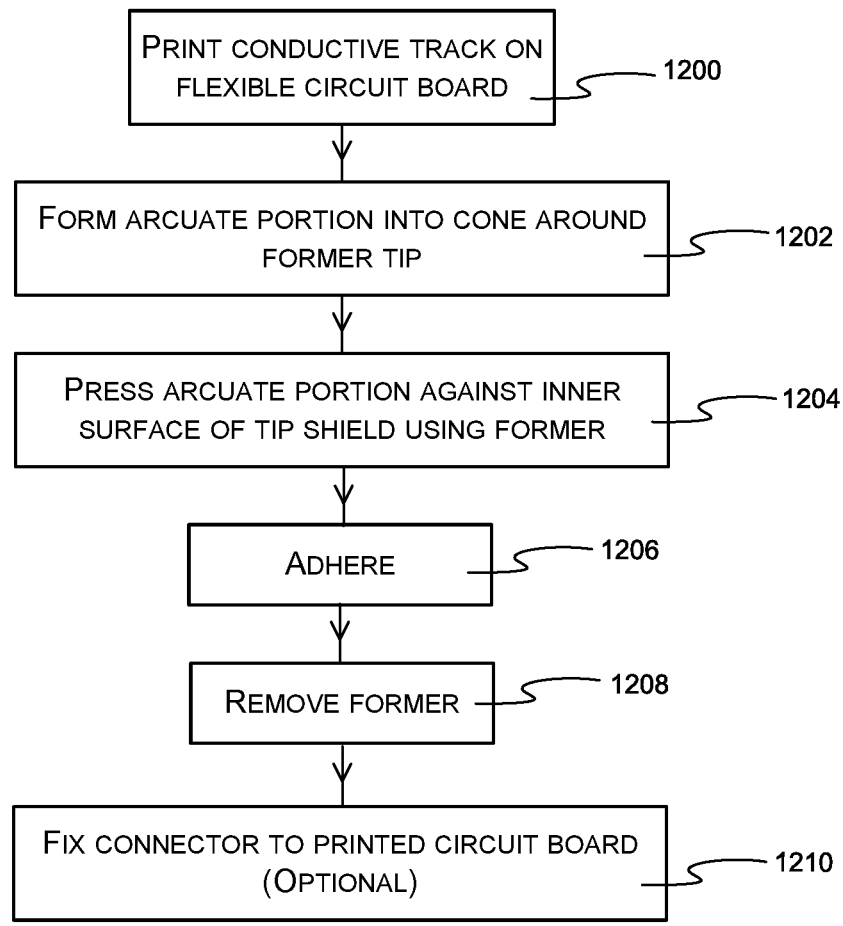
FIG. 12 is a flow diagram of a method of fixing a tilt transmitter into a stylus.

FIG. 12 is a flow diagram of a method of manufacture of a stylus comprising printing 1200 a conductive track on a flexible substrate such as a flexible printed circuit board. The conductive track comprises one or more regions which act as transmitters, and an elongate portion, one elongate portion per transmitter. The elongate portions run from a transmitter along a length of an elongate portion of the flexible substrate. The flexible substrate is cut to form an arcuate portion and an elongate portion to form generally a Y shape. The method comprises forming 1202 an arcuate portion of the flexible substrate into a cone by bending the arcuate portion. The resulting cone is placed around a former tip.

The arcuate portion, now in a cone shape, is pressed 1204 against an inner surface of a tip shield using the former and adhered 1206 using pressure sensitive adhesive which is present on the flexible substrate.

The former is removed 1208 and the connector is fixed 1210 to the electronic circuitry in the stylus.

Alternatively or in addition to the other examples described herein, examples include any combination of the following:

A stylus for operation with a digitizer device, the stylus comprising:

a housing;

at least one transmitter within the housing;

electronic circuitry within the housing, the electronic circuitry configured to generate a signal for transmission by the transmitter such that in use, the digitizer device is able to detect the transmitted signal and infer a position of the transmitter with respect to the digitizer device; and an electrically conducting connector directly connecting the transmitter to the electronic circuitry, the connector configured to convey the generated signal from the electronic circuitry to the transmitter; and wherein the connector and the transmitter are formed as a single element.

The stylus described above wherein the connector and the transmitter are formed as a single element being a single piece of wire.

The stylus described above wherein the connector and the transmitter are formed as a single element being a conductive track on a flexible printed circuit.

The stylus described above wherein the flexible printed circuit comprises a plurality of transmitters each having an associated connector connecting the respective transmitter to the electronic circuitry, and wherein each transmitter and corresponding connector are formed as a single element being a conductive track on the flexible printed circuit.

The stylus described above wherein the plurality of transmitters are configured to transmit signals to the digitizer device such that the digitizer device is able to compute rotation of the stylus with respect to the digitizer device.

The stylus described above wherein the stylus comprises a tip and a distal end, and wherein the transmitter is located in the housing at a position spaced from the tip and the distal end.

The stylus of described above wherein the transmitter comprises a conical portion fitted against a surface of a tip shield of the stylus, wherein the tip shield is a conical element of the housing at the tip of the stylus.

The stylus described above wherein the connector and the transmitter are formed as a single element being a conductive track on a flexible printed circuit and wherein the conductive track comprises an arcuate region which forms the conical portion of the transmitter, and an elongate portion connecting the transmitter to the electronic circuitry.

The stylus described above wherein the conical portion is formed from a coiled portion of a wire and wherein the connector and the transmitter are formed as a single element being the coiled portion of the wire and a non-coiled portion of the wire, where the non-coiled portion of the wire extends from the conical portion to the electronic circuitry.

The stylus described above wherein the coiled portion comprises coils of wire which are touching one another.

The stylus described above wherein the stylus comprises a tip and a distal end and wherein the transmitter is located in the housing at the distal end, and wherein the transmitter comprises a substantially hemi-spherical portion.

The stylus described above wherein the connector and the transmitter are formed as a single element being a conductive track on a flexible printed circuit, and wherein the flexible printed circuit comprises a conical portion and an elongate portion, the conical portion fitting against a tip shield of the housing and the elongate portion running along a longitudinal axis of the stylus to the electronic circuitry.

The stylus described above wherein the flexible printed circuit is fixed to the tip shield using pressure sensitive adhesive.

The stylus described above wherein the elongate portion comprises part of a pin and socket interconnector to connect the flexible printed circuit board to the electronic circuitry.

The stylus described above wherein the flexible printed circuit comprises a plurality of transmitters each having an associated connector connecting the respective transmitter to the electronic circuitry, and wherein each transmitter and corresponding connector are formed as a single element being a conductive track on the flexible printed circuit.

A method of operating a stylus with a digitizer device, the method comprising:

generating a signal, using electronic circuitry in the stylus, the signal being for transmission by a transmitter in the stylus to a digitizer device such that the digitizer device is able to infer a position of the transmitter with respect to the digitizer device; and conveying the generated signal from the electronic circuitry to the transmitter, using an electrically conducting connector directly connecting the transmitter to the electronic circuitry; and configuring the transmitter and the electrically conducting connector as a single element.

A transmitter of a stylus the transmitter comprising:

a transmitting element configured to transmit a signal to a digitizer device;

an electrically conducting connector configured to directly connect the transmitting element to electronic circuitry in the stylus, the connector configured to convey a signal generated by the electronic circuitry to the transmitter for transmission as the signal to the digitizer device; and wherein the connector and the transmitter are integrated.

The transmitter described above wherein the connector and the transmitter are formed as a single conductive track on a flexible printed circuit.

The transmitter described above wherein the flexible printed circuit comprises a plurality of transmitters each having an associated connector connecting the respective transmitter to the electronic circuitry, and wherein each transmitter and corresponding connector are formed as a single element being a conductive track on the flexible printed circuit.

The transmitter described above wherein the connector and the transmitter are formed from a single wire with a coiled portion of the wire forming the transmitter and a non-coiled portion of the wire forming the connector.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The operations of the methods described herein may be carried out in any suitable order, or simultaneously where appropriate. Additionally, individual blocks may be deleted from any of the methods without departing from the scope of the subject matter described herein. Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the scope of this specification.

The invention claimed is:

1. A stylus for operation with a digitizer device, the stylus comprising:

a housing;

a transmitter within the housing;

electronic circuitry within the housing, the electronic circuitry configured to generate a signal for transmission by the transmitter such that in use, the digitizer device is able to detect the transmitted signal and infer a position of the transmitter with respect to the digitizer device; and an electrically conducting connector directly connecting the transmitter to the electronic circuitry with no intervening element between the transmitter and the electronic circuitry, the connector configured to convey the generated signal from the electronic circuitry to the transmitter; and wherein the connector and the transmitter are formed as a single element.

2. The stylus of claim 1 wherein the connector and the transmitter are formed as a single element being a single piece of wire.

3. The stylus of claim 1 wherein the connector and the transmitter are formed as a single element being a conductive track on a flexible printed circuit.

4. The stylus of claim 3 wherein the flexible printed circuit comprises a plurality of transmitters each having an associated connector connecting the respective transmitter to the electronic circuitry, and wherein each transmitter and corresponding connector are formed as a single element being a conductive track on the flexible printed circuit.

5. The stylus of claim 4 wherein the plurality of transmitters are configured to transmit signals to the digitizer device such that the digitizer device is able to compute rotation or tilt of the stylus with respect to the digitizer device.

6. The stylus of claim 1, further comprising a second transmitter, wherein the stylus comprises a tip and a distal end, and wherein the transmitter is located in the tip and the second transmitter is located in the distal end.

7. The stylus of claim 6 wherein the transmitter comprises a conical portion fitted against a surface of a tip shield of the stylus, wherein the tip shield is a conical element of the housing at the tip of the stylus.

8. The stylus of claim 7 wherein the connector and the transmitter are formed as a single element being a conductive track on a flexible printed circuit and wherein the conductive track comprises an arcuate region which forms the conical portion of the transmitter, and an elongate portion connecting the transmitter to the electronic circuitry.

9. The stylus of claim 7 wherein the conical portion is formed from a coiled portion of a wire and wherein the connector and the transmitter are formed as a single element being the coiled portion of the wire and a non-coiled portion of the wire, where the non-coiled portion of the wire extends from the conical portion to the electronic circuitry.

10. The stylus of claim 6 wherein the electronic circuitry is positioned between the transmitter and the second transmitter.

11. The stylus of claim 1 wherein the stylus comprises a tip and a distal end and wherein the transmitter is located in the housing at the distal end, and wherein the transmitter comprises a substantially hemi-spherical portion.

12. The stylus of claim 1 wherein the connector and the transmitter are formed as a single element being a conductive track on a flexible printed circuit, and wherein the flexible printed circuit comprises a conical portion and an elongate portion, the conical portion fitting against a tip shield of the housing and the elongate portion running along a longitudinal axis of the stylus to the electronic circuitry.

13. The stylus of claim 12 wherein the flexible printed circuit is fixed to the tip shield using pressure sensitive adhesive.

14. The stylus of claim 12 wherein the elongate portion comprises part of a pin and socket interconnector to connect the flexible printed circuit board to the electronic circuitry.

15. The stylus of claim 12 wherein the flexible printed circuit comprises a plurality of transmitters each having an associated connector connecting the respective transmitter to the electronic circuitry, and wherein each transmitter and corresponding connector are formed as a single element being a conductive track on the flexible printed circuit.

16. A method of operating a stylus with a digitizer device, the method comprising:
generating a signal, using electronic circuitry in the stylus, the signal being for transmission by a transmitter in the stylus to a digitizer device such that the digitizer device is able to infer a position of the transmitter with respect to the digitizer device; and
conveying the generated signal from the electronic circuitry to the transmitter, using an electrically conducting connector directly connecting the transmitter to the electronic circuitry with no intervening element between the connector and the transmitter; and
configuring the transmitter and the electrically conducting connector as a single element.

17. A transmitter of a stylus, the transmitter comprising:
a transmitting element configured to transmit a signal to a digitizer device;
an electrically conducting connector configured to directly connect the transmitting element to electronic circuitry in the stylus with no intervening element between the connector and the transmitter, the connector configured to convey a signal generated by the electronic circuitry to the transmitter for transmission as the signal to the digitizer device; and
wherein the connector and the transmitter are integrated.

18. The transmitter of claim 17 wherein the connector and the transmitter are formed as a single conductive track on a flexible printed circuit.

19. The transmitter of claim 18 wherein the flexible printed circuit comprises a plurality of transmitters each having an associated connector connecting the respective transmitter to the electronic circuitry, and wherein each transmitter and corresponding connector are formed as a single element being a conductive track on the flexible printed circuit.

20. The transmitter of claim 17 wherein the connector and the transmitter are formed from a single wire with a coiled portion of the wire forming the transmitter and a non-coiled portion of the wire forming the connector.

* * * * *